United States Patent [19]

Svilans

[11] Patent Number: 4,574,730

[45] Date of Patent: Mar. 11, 1986

[54] MELT DISPENSING LIQUID PHASE EPITAXY BOAT

[75] Inventor: Mikelis N. Svilans, Kanata, Canada

[73] Assignee: Northern Telecom Limited, Montreal, Canada

[21] Appl. No.: 583,985

[22] Filed: Feb. 27, 1984

[51] Int. Cl.$^4$ .......................................... H01L 21/208
[52] U.S. Cl. .................................... 118/412; 118/415; 118/421
[58] Field of Search ....................... 118/412, 415, 421; 148/171, 172; 156/621, 622, 624

[56] References Cited

U.S. PATENT DOCUMENTS

| | | | |
|---|---|---|---|
| 3,565,702 | 2/1971 | Nelson | 148/172 |
| 3,690,965 | 9/1972 | Bergh et al. | 118/415 X |
| 3,753,801 | 8/1973 | Lockwood et al. | 118/415 X |
| 4,123,302 | 10/1978 | Marinelli | 118/415 X |

FOREIGN PATENT DOCUMENTS 115062  7/1979  Japan .................................... 118/415

OTHER PUBLICATIONS

Paper by L. R. Dawson, entitled: "Liquid Phase Epitaxy (LPE) Techniques for Compound Semiconductor Growth", published 1982 in SPIE, vol. 323, p. 138.
Paper by S. Y. Leung et al, entitled: "Slider Induced Convection in Horizontal Liquid Phase Epitaxy (LPE) System", published 1982 in SPIE, vol. 323, p. 156.
Paper by K, Takahei et al, entitled: "LPE Growth of 1.5–1.6 μm $In_{1-x}Ga_xAs_{1-y}P_y$ Crystals by a Modified Source-Seed Method", published 1981 in the Journal of Crystal Growth 51, p. 541.

Primary Examiner—John P. McIntosh
Attorney, Agent, or Firm—Stuart L. Wilkinson

[57] ABSTRACT

An improved melt dispensing liquid phase epitaxy (LPE) boat is disclosed. It comprises two separable compartments. A supply-melt reservoir and a growth-melt bin separable by means of a separation slider for separating the two compartments prior to the actual process of epitaxial growth. In a further improvement, the substrate holder has a melt collection bin for receiving used growth-melt.

1 Claim, 2 Drawing Figures

MELT DISPENSING LIQUID PHASE EPITAXY BOAT

FIELD OF THE INVENTION

The present invention relates to semiconductor manufacturing processes, in particular those employing liquid phase epitaxy (LPE) techniques. More particularly still, the invention relates to a boat structure in which epitaxial layers are grown on substrates from a liquid source melt under application of high temperatures.

BACKGROUND OF THE INVENTION

A review paper by L. R. Dawson entitled "Liquid phase epitaxy (LPE) techniques for compound semiconductor growth" published 1982 in SPIE Vol. 323 at 138 is a good summary of the current status of LPE. The abstract of this paper summarizes LPE as follows:

"Liquid phase epitaxy (LPE) is a method of crystal growth well suited to the preparation of a wide range of compound semiconductor materials including GaAs, AlAs, GaP, InP, and GaSb, as well as their ternary and quaternary alloys. The advantages of LPE over other solution growth methods are substantial, primarily in material purity, doping flexibility and dimensional control. It has particular advantages in achieving the complex multilayer structures required for many interesting optical devices, such as injection lasers, light emitting diodes, and photodetectors. LPE has appeared in many configurations in recent years, with the dominant variation at present being the sliding boat method. A good understanding of the capabilities of this method can be obtained by studying the growth of GaAs-Al$_x$Ga$_{1-x}$As heterostructures".

In manufacturing the above mentioned multilayered structures the control and uniformity of layer thickness are of paramount importance. In particular, uniformity from substrate to substrate and batch to batch is critical.

In addition to thickness uniformity, purity and freedom from contamination resulting from so-called cross-contamination of the source melt are also important.

The most commonly used LPE boat, a machined graphite carrier for substrate and source melt, dates back to U.S. Pat. No. 3,565,702 issued 1971 to H. Nelson.

Variations and improvements on the basic boat of Nelson are discussed in two papers. The first by S. Y. Leung and N. E. Schumaker deals with "Slider induced convection in horizontal liquid phase expitaxy (LPE) system", is published 1982 in SPIE Vol. 323, p. 156 and examines the conventional, the confined and the baffled melt holders, finding the last two equally preferable to the first.

The second paper by K. Takahei and H. Nagai entitled "LPE GROWTH OF 1.5–1.6 μm In$_{1-x}$Ga$_x$As$_{1-y}$P$_y$ CRYSTALS BY A MODIFIED SOURCE-SEED METHOD" published 1981 in the Journal of Crystal Growth 51, p. 541 describes a process in which the top of the source melt is removed prior to epitaxial growth. The paper concludes:

"1.5–1.6 μm wavelength region InP/InGaAsP/InP double heterostructure crystals were grown at a relatively low temperature (592° C.) in order to prevent the melt-back of the quaternary layer. A high reproducibility of quaternary layer properties, such as layer thickness, wavelength, and lattice matching with InP, has been accomplished even at such low temperature by utilizing a modified source-seed (MSS) method. Relations between LPE growth conditions of the MSS method and the properties of the quaternary layers were formulated in a convenient way for use in an actual practice of LPE growth, and double heterostructure crystals with quaternary layers of various wavelengths, which lattice match to InP, have been grown with high controllability. Such a technique is very useful for fabricating semiconductor lasers of various wavelength in the 1.5–1.6 μm wavelength region, where an optical communication system with wavelength multiplexing is expected".

SUMMARY OF THE INVENTION

The present invention endeavours to improve further the LPE processes by providing an improved melt dispensing LPE boat. Thus the general object of the invention is to provide a boat which facilitates:

Reuse of the source melts without undue contamination;

Speeding up of the LPE process;

Fine adjustment of melt composition on the basis of previous runs;

Use of thinner growth-melts to reduce melt motion during substrate transfer and improve layer thickness control; and Use of multiple bins for multi-layer epitaxy.

Accordingly, the present invention provides an improved melt dispensing liquid phase epitaxy (LPE) boat comprising:

(a) a substrate holder having recesses for holding substrates;

(b) a growth-melt holder contiguous said substrate holder having growth-melt bins;

(c) a supply-melt holder contiguous said growth-melt holder having supply-well reservoirs substantially larger than said growth-melt bins;

(d) said supply-well reservoirs each having a bottom opening alignable with any of said growth-melt bins to permit supply-well melt to flow into a growth-melt bin; and (e) said growth-melt bins each having a bottom opening alignable with any of said recesses.

In a further improvement of the invention, the substrate holder has, in addition to substrate bins, a melt collection bin for receiving used growth-melt. The melt collection bin is simply a recess of sufficient size to receive the discard growth-melt and is positioned in the substrate holder behind the last substrate bin.

BRIEF DESCRIPTION OF THE DRAWINGS

The preferred embodiment will now be described in conjunction with the annexed drawings in which.

DETAILED DESCRIPTION OF THE PREFERRED EMBODIMENT

Figure 1:
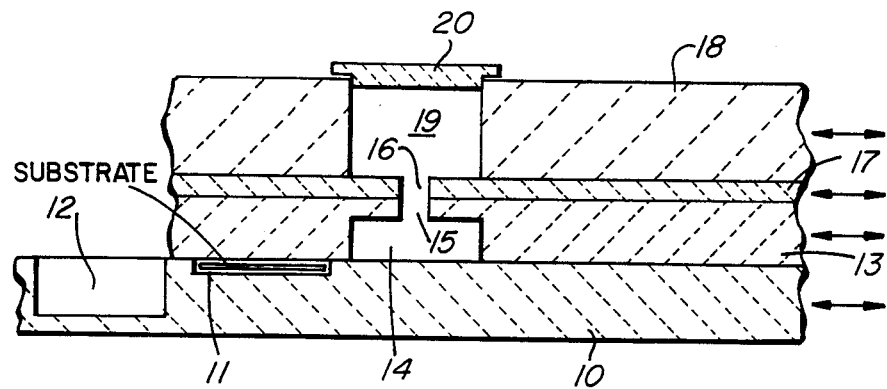
FIG. 1 depicts in cross-section a portion of an LPE boat according to the present invention.

Referring now to FIG. 1 of the drawings, the LPE boat comprises a substrate holder 10 having a substrate recess 11 and a melt collection bin 12, both machined in the upper surface of the graphite holder 10 as is well known in the art. Contiguous the upper surface of the substrate holder 10 is a graphite growth-melt holder 13 having a growth-melt bin 14 which is fully open towards the substrate holder but has a narrow aperture 15 at its top. The aperture 15 is shown aligned with a coextensive aperture 16 in a graphite separation slider 17 contiguous the upper surface of the growth-melt holder 13. A graphite supply-melt-holder 18 is contiguous the upper surface of the separation slider 17, and is shown having a supply-melt reservoir 19, which is fully open on both sides of the holder 18, aligned with both the apertures 16 and 15. A graphite cover 20 covers the upper opening of the reservoir 19.

Normally, but not necessarily, the bins, recesses and reservoirs are rectangular in shape. Also, an LPE boat would have a plurality of bins, recesses and reservoirs as well as apertures in the slider to permit simultaneous or sequential epitaxial growth operations.

Figure 2:
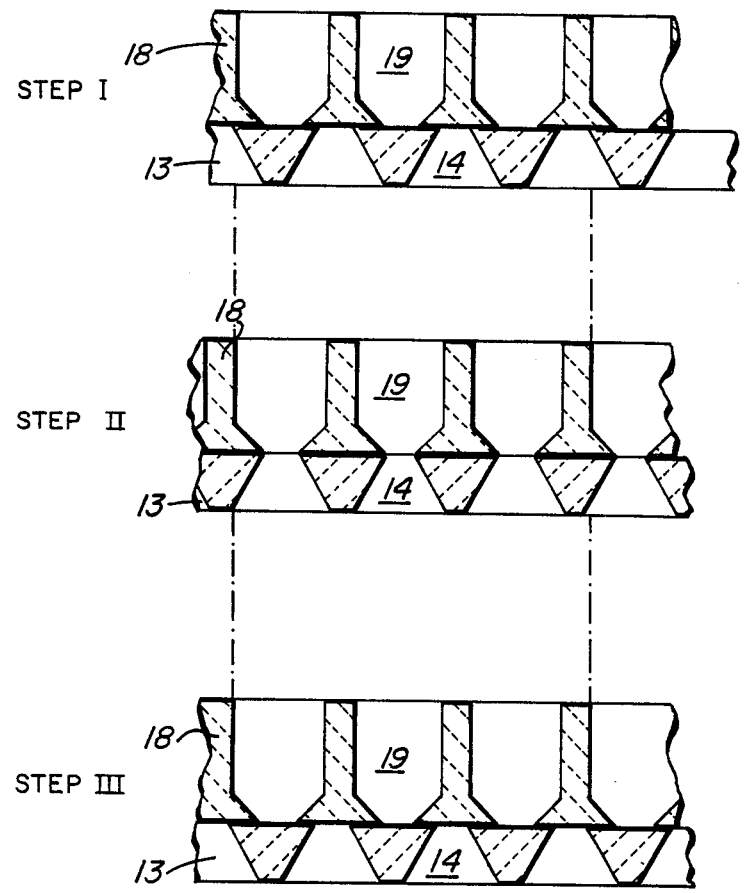
FIG. 2 depicts in cross-section an alternative embodiment of a part of the LPE boat in FIG. 1 and illustrates three steps in the process of use of such alternative embodiment.

The components of the LPE boat are all held together in graphite shell as is shown, for example, in FIG. 2 of the herein referenced paper by Leung and Schumaker.

Because the growth-melt bin 14 is filled from the reservoir 19, which is then closed by the slider 17, prior to the alignment of the bin 14 with the substrate recess 1 and prior to the epitaxial growth phase, the supply-melt in the reservoir 19 remains uncontaminated for subsequent operations without need of refilling it as often as with LPE boats lacking the separation slider 17. In addition to mitigating cross-contamination, the LPE process is speeded up thereby. Moreover, due to the new permissible shallowness of the growth-melt bin 14, melt motion is reduced during substrate holder 10 movement and a more uniform (steady state) layer growth results.

Turning now to FIG. 2 of the drawings, an alternative embodiment to that of FIG. 1 is shown. In this embodiment the slider 17 of FIG. 1 is integral with the supply-melt holder 18. This is accomplished by progressively narrowing the lower portion of the supply-melt reservoirs 19, which permits continued efficient use of the bulk of supply-melt holder 18 body. Similarly, the growth-melt bins 14 are progressively narrower towards the top, so that they may be fully blocked prior to the filling phase of the process as is shown in Step I in FIG. 2. In Step 11, the growth-bins 14 are being filled, the growth-melt holder 13 having been shifted relative to the supply-melt holder 18. In Step 111, the growth-melt bins 14 having been filled, the holder 13 again is shifted relative to the holder 18 and the supply-melt reservoirs 19 are now protected from contamination during the growth phase of the process.

Currently, the most common material for these LPE boats is graphite. Boron nitride, however, has begun to be used. Silica (or quartz) is not suitable for use in current processes due to wetting problems. By using the LPE boat of the present invention, however, it is likely that at least for some applications these problems can be circumvented. Needless to say, the material of which the LPE boat of the present invention is made is not critical as far as the structure provided herein is concerned. As will be appreciated by those skilled in the art, the improved LPE boat structure permits process flexibility and reduced growth preparation time, particularly in multi-layer epitaxy, while at the same time improving process results.

What is claimed is:

1. A melt dispensing liquid phase epitaxy boat particularly for epitaxially growing multilayer structures, the boat comprising:
    (a) a substate holder having a recess for holding a substrate;
    (b) a growth-melt holder contiguous said substrate holder, the growth-melt holder having a plurality of growth-melt bins spaced therein;
    (c) a supply-melt holder contiguous said growth-melt holder, the supply-melt holder having a plurality of supply-melt reservoirs having spacing corresponding to the spacing of the growth-melt bins in said growth-melt holder, the supply-melt reservoirs being several times larger in volume than said growth-melt bins;
    (d) said supply-melt reservoirs each tapering downwardly to a bottom opening and the growth-melt bins each tapering upwardly to a top opening;
    said supply-melt holder and the growth-melt holder being relatively slidable between a position in which the supply-melt reservoir bottom openings are aligned with the growth-melt bin top openings to permit dispensation of supply-melt of different composition from the spaced supply-melt reservoirs to respective growth-melt bins, and a position in which the supply-melt bottom reservoirs are blocked from the growth-melt bin top openings thereby to cut off fluid communication between the reservoirs and the respective growth-melt bins, the growth-melt holder and the substrate holder being relatively slidable to bring the substrate into alignment with openings at the bottom of successive growth-melt bins whereby successive layers of varied composition can be epitaxially grown.

* * * * *